United States Patent
Wei

(10) Patent No.: US 8,049,450 B2
(45) Date of Patent: Nov. 1, 2011

(54) FAN CONTROL CIRCUIT

(75) Inventor: Han-Kang Wei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 631 days.

(21) Appl. No.: 12/189,126

(22) Filed: Aug. 8, 2008

(65) Prior Publication Data

US 2009/0278487 A1  Nov. 12, 2009

(30) Foreign Application Priority Data

May 8, 2008  (CN) .......................... 2008 1 0301475

(51) Int. Cl.
   *H02K 17/32* (2006.01)

(52) U.S. Cl. ............... 318/434; 318/400.21; 318/400.23

(58) Field of Classification Search .................. 318/434, 318/439, 400.23, 200.01, 400.22, 430, 471; 388/806
See application file for complete search history.

(56) References Cited

U.S. PATENT DOCUMENTS

| 5,457,766 A | 10/1995 | Ko |
| 6,954,354 B2 * | 10/2005 | Shyr .......................... 361/679.33 |
| 2003/0001531 A1 * | 1/2003 | Xi .................................. 318/254 |
| 2005/0047762 A1 * | 3/2005 | Liu et al. ...................... 388/806 |

FOREIGN PATENT DOCUMENTS

CN  1601422 A  3/2005

* cited by examiner

*Primary Examiner* — Karen Masih
(74) *Attorney, Agent, or Firm* — Altis Law Group, Inc.

(57) ABSTRACT

A fan control circuit for controlling a fan to dissipate heat from an electrical device includes a comparator and an electrical switch. The comparator has a comparator input terminal, a comparator reference terminal, and a comparator output terminal. The comparator input terminal is connected to a power source via a first resistor and is also connected to the electrical device to receive a working current draw of the electrical device. The comparator reference terminal is receiving a reference voltage. The comparator output terminal is capable of outputting a comparison result between a voltage received by the input terminal and the reference voltage. The electrical switch has a control terminal, a first terminal, and a second terminal. The control terminal is connected to the comparator output terminal of the comparator to receive the comparison result. The first terminal is connected to the power source via a resistor. The second terminal is grounded and connected to the terminal via a fan.

14 Claims, 1 Drawing Sheet

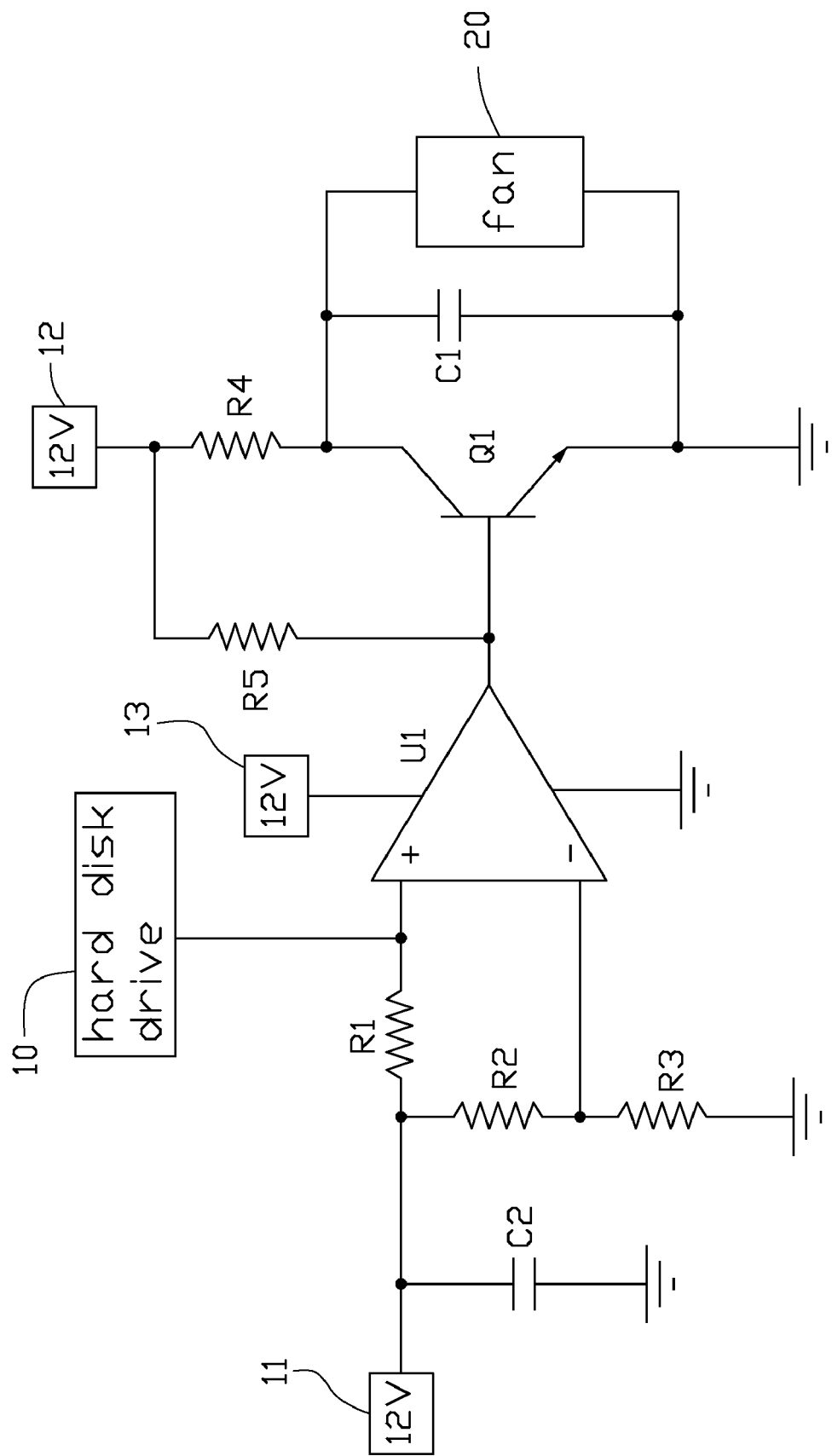

FAN CONTROL CIRCUIT

BACKGROUND

1. Field of the Invention

Embodiments of the present disclosure relate to cooling fans, and more particularly to a fan control circuit.

2. Description of Related Art

An electronic device usually requires cooling of the power supply or one or more components of the device. Traditionally, a fan may be used to cool the device where continuous rotation of the fan dissipates unwanted heat away from the device. A fan usually continuously rotates whenever the power supply of the equipment body is turned on, which may lead to undesired results. Unwanted noise from the fan rotation may be present in an environment where quietness is required. Additionally, continuous rotation of the fan will inevitably lead to accelerated deterioration in the equipment.

What is desired, therefore, is to provide a fan control circuit which controls the rotational speed of the fan to efficiently dissipate heat.

SUMMARY

An embodiment of a fan control circuit for controlling a fan to dissipate heat from an electrical device includes a comparator and an electrical switch. The comparator has an input terminal, a reference terminal, and an output terminal. The input terminal is connected to a power source via a first resistor and connected to an input of the electrical device for receiving a working currents draw of the electrical device. The reference terminal is receiving a reference voltage. The output terminal is capable of outputting a comparison result. The electrical switch has a control terminal, a first terminal, and a second terminal. The control terminal is connected to the output terminal of the comparator for receiving the comparison result. The first terminal is connected to the power source via a resistor. The second terminal is grounded and connected to the terminal via a fan.

Other advantages and novel features of the present disclosure will become more apparent from the following detailed description of certain inventive embodiments when taken in conjunction with the accompanying drawing.

BRIEF DESCRIPTION OF THE DRAWINGS

The drawing is a circuit diagram of a fan control circuit in accordance with an embodiment of the present invention.

DETAILED DESCRIPTION

Referring to the drawing, a fan control circuit 1 in accordance with one embodiment of the present disclosure is shown. The fan control circuit 1 is configured to control a fan to turn on or turn off to dissipate heat generated by an electronic device. The fan control circuit 1 includes a comparator U1 and an electrical switch Q1.

The comparator U1 includes a non-inverting terminal as a comparator input terminal, an inverting terminal as a comparator reference terminal, a comparator power terminal, a comparator grounded terminal, and a comparator output terminal. The comparator input terminal is connected to a power source 11 via a resistor R1 and also connected to an electrical device, such as a hard disk drive (HDD) 10. The HDD 10 may be used to supply work currents to the comparator input terminal. The power source is grounded via a filter capacitor C2. The power source 11 is connected to the ground via a resistor R2 and resistor R3 in series to form a voltage-divider and may be 12V, in one particular embodiment. The comparator reference terminal is connected to a node between the resistor R2 and the resistor R3 to receive the divided voltage of the voltage-divider as a reference voltage of the comparator U1. The comparator compares voltage between the input and the reference terminal of the comparator U1. The comparator output terminal is capable of outputting a comparison result. The comparator power terminal is connected to power source 13 which may be 12V, in one embodiment. The comparator grounded terminal is grounded.

The electrical switch Q1 includes a first terminal, a second terminal, and a control terminal. The control terminal is connected to the comparator output terminal to receive the comparison result and connected to a power source 12 via a resistor R5. The first terminal is connected to the power source via a resistor R4. The second terminal is grounded. A fan 20 and a capacitor C1 are connected in parallel between the electrical switch first and second terminals. The power source 12, in one embodiment, may be 12V. It may be understood that the power source 11, the power source 12, and the power source 13 may be one power source supply power to the fan control circuit 1. However, in other embodiments, the power source 11, the power source 12, and the power source 13 may comprise independent power sources of varying voltage values.

In one embodiment, the electrical switch Q1 is an NPN transistor. The control terminal, first terminal, and second terminal of the electrical switch Q1 are the base, emitter and collector of the transistor, respectively. The capacitors C1 and C2 are used for maintaining a steady flow of voltage, and can be omitted depending on the embodiment, to save costs.

The HDD 10, in one embodiment, has five working states, such as spin up, idle, operating, standby, and sleep. It may be understood that these five working states of the HDD 10 correspond to working currents of the HDD 10 and may be found in the specification of the HDD 10. It may be further understood that the working currents of the HDD during the spin up, idle, and operating states is greater than the working currents of the HDD during the standby and sleep states. The voltage of the comparator non-inverting terminal U is the voltage of the power source 13 minus I×R, wherein I denotes the working current of the HDD 10 and R denotes the resistance of the resistor R1. According to the formula, the voltage of the comparator input terminal U at the spin up, idle, and operating states is greater than the voltage U during the comparator reference terminal at the standby and sleep states. In configuring a reference voltage of the comparator inverting terminal, the reference voltage is set between the voltage of the comparator non-inverting terminal during the spin up, idle, and operating states. The voltage of the comparator non-inverting terminal during the standby and sleep states may be adjusted by adjusting the resistance of the resistor R2 and R3.

The hard disc 10 may be in the standby or in the sleep state if the voltage of the comparator non-inverting terminal is greater than the reference voltage. If the voltage of the comparator non-inverting terminal is greater than the reference voltage, the comparator output terminal outputs a high level to turn on the electrical switch Q1 causing the two terminals of the fan 20 to be grounded. Because the two terminals of the fan are grounded, the fan 20 will not rotate.

The hard disc 10 may be in the spin up, in the idle or in the operating states if the voltage value of the comparator non-inverting terminal is smaller than the reference voltage. If the voltage value of the comparator non-inverting terminal is smaller than the reference voltage, the comparator output terminal outputs a low level to turn off the electrical switch Q1. Subsequently, the power 12 may be supplied to the fan 20 for the fan to rotate.

In one embodiment, the reference voltage can be set to different values based on user-specific needs. The fan control circuit determines the working state of the fan in accordance with the working currents of the hard disc 10 to control a rotational speed of the fan 20, thereby saving power and reducing noise.

It is to be understood, however, that even though numerous characteristics and advantages of the present disclosure have been set forth in the foregoing description, together with details of the structure and function of the present disclosure, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A fan control circuit for controlling a fan to dissipate heat from an electrical device, comprising:
a comparator comprising an input terminal connected to a power source via a first resistor, and connected to an input of the electrical device for receiving a working current draw of the electrical device, a reference terminal for receiving a reference voltage, and an output terminal for outputting a comparison result according to a voltage received by the input terminal and the reference voltage, wherein the voltage at the input terminal is inversely proportional to the working current draw of the electrical device multiplied by the resistance of the first resistor; and
an electrical switch comprising a control terminal connected to the output terminal of the comparator for receiving the comparison result, a first terminal connected the power source via a second resistor, and a second terminal grounded, the fan being connected to the first terminal;
wherein the fan is turned on or turned off according to the working current draw of the electrical device.

2. The fan control circuit as claimed in claim 1, wherein the power source is connected to ground via a voltage divider comprising a third resistor and a fourth resistor connected in series, wherein the reference terminal is connected to a node between the third and fourth resistors to receive the divided voltage of the voltage divider as a reference voltage.

3. The fan control circuit as claimed in claim 1, wherein the input terminal is a non-inverting terminal of the comparator, and the reference terminal is an inverting terminal of the comparator.

4. The fan control circuit as claimed in claim 2, wherein the electrical switch is an NPN transistor, and the control, first, and second terminals are the base, collector, and emitter of the transistor, respectively.

5. The fan control circuit as claimed in claim 1, wherein the power source is connected to the control terminal of the electrical switch via a fifth resistor to raise a voltage at the control terminal.

6. The fan control circuit as claimed in claim 1, wherein the power source is 12V.

7. The fan control circuit as claimed in claim 1, wherein a filter capacitor is connected between the power source and ground.

8. A control circuit, comprising:
a hard disk drive;
a fan for dissipating heat from the hard disk drive;
a comparator comprising an input terminal connected to a power source via a first resistor, and connected to the hard disk drive to receive a working current of the hard disk drive, a reference terminal for receiving a reference voltage, and an output terminal for outputting a comparison result according to a first voltage received by the input terminal and the reference voltage, wherein the working current of the hard disk drive varies according to different working states of the hard disk drive, and the first voltage at the input terminal accords to the formula V-I*R, where V denotes a voltage of the power source, I denotes the working current of the hard disk drive, and R denotes the resistance of the first resistor; and
an electrical switch comprising a control terminal connected to the output terminal of the comparator for receiving the comparison result, a first terminal connected to the power source via a second resistor, and a second terminal grounded and connected to the first terminal via the fan, wherein the fan turns on or turns off according to the working current of the hard disk drive.

9. The control circuit as claimed in claim 8, wherein the power source is connected to ground via a voltage divider comprising a third resistor and a fourth resistor connected in series, wherein the reference terminal is connected to a node between the third and fourth resistors to receive the divided voltage of the voltage divider as a reference voltage.

10. The control circuit as claimed in claim 8, wherein the input terminal is a non-inverting terminal of the comparator, and the comparator reference terminal is an inverting terminal of the comparator.

11. The control circuit as claimed in claim 10, wherein the electrical switch is an NPN transistor, and the control, first, and second terminals are the base, collector, and emitter of the transistor, respectively.

12. The control circuit as claimed in claim 8, wherein the power source is connected to the control terminal of the electrical device via a fifth resistor.

13. The control circuit as claimed in claim 8, wherein the power source is 12V.

14. The control circuit as claimed in claim 8, wherein a filter capacitor is connected between the power source and ground.

* * * * *